(12) United States Patent
Doering et al.

(10) Patent No.: US 11,456,674 B2
(45) Date of Patent: Sep. 27, 2022

(54) CONVERTER ASSEMBLY

(71) Applicant: Siemens Energy Global GmbH & Co. KG, Munich (DE)

(72) Inventors: David Doering, Erlangen (DE); Gerald Franz Giering, Kalchreuth (DE); Alexander Rentschler, Bensheim (DE); Klaus Wuerflinger, Nuremberg (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 152 days.

(21) Appl. No.: 16/765,951

(22) PCT Filed: Nov. 21, 2017

(86) PCT No.: PCT/EP2017/079863
§ 371 (c)(1),
(2) Date: May 21, 2020

(87) PCT Pub. No.: WO2019/101288
PCT Pub. Date: May 31, 2019

(65) Prior Publication Data
US 2020/0336079 A1   Oct. 22, 2020

(51) Int. Cl.
*H02M 7/00* (2006.01)
*H05K 7/14* (2006.01)
(Continued)

(52) U.S. Cl.
CPC .......... *H02M 7/003* (2013.01); *H05K 7/1432* (2013.01); *H05K 7/20263* (2013.01); *H05K 7/20927* (2013.01); *H02M 7/4835* (2021.05)

(58) Field of Classification Search
CPC .. H02M 7/003; H02M 7/4835; H05K 7/1432; H05K 7/20263; H05K 7/20927
See application file for complete search history.

(56) References Cited

U.S. PATENT DOCUMENTS

| 2012/0057308 A1 | 3/2012 | Sihler |
| 2016/0192540 A1* | 6/2016 | Riedel ................. H05K 7/1432 361/699 |

(Continued)

FOREIGN PATENT DOCUMENTS

| EP | 2825009 A1 | 1/2015 |
| WO | 2008106908 A1 | 9/2008 |

(Continued)

OTHER PUBLICATIONS

Asada, Shinsuke et al.: "Resin Encapsulation Combined with Insulated Metal Baseplate for Improving Power Module Reliability", PCIM Europe 2016, May 10-12, 2016, Nürenberg, Germany; XP055784122, ISBN 978-3-8007-4186-1, pp. 326-330.

*Primary Examiner* — Adolf D Berhane
*Assistant Examiner* — Afework S Demisse
(74) *Attorney, Agent, or Firm* — Laurence A. Greenberg; Werner H. Stemer; Ralph E. Locher

(57) ABSTRACT

A converter assembly includes a converter with converter valves, each having power semiconductor switches. At least one fluid-tight encapsulation housing, in which at least some of the power semiconductor switches are disposed, forms a modular converter unit. The encapsulation housing is at least partially filled with an electrically insulating insulation fluid in order to electrically insulate the power semiconductor switches disposed in the encapsulation housing.

9 Claims, 1 Drawing Sheet

(51) Int. Cl.
*H05K 7/20* (2006.01)
*H02M 7/483* (2007.01)

(56) References Cited

U.S. PATENT DOCUMENTS

2018/0331017 A1* 11/2018 Straßer ................ B60L 15/007
2019/0123658 A1*  4/2019 Kapelke ................ H01L 25/112

FOREIGN PATENT DOCUMENTS

| WO | 2016082863 A1 | 6/2016 |
| WO | 2016134786 A1 | 9/2016 |
| WO | 2017044681 A1 | 3/2017 |

* cited by examiner

CONVERTER ASSEMBLY

BACKGROUND OF THE INVENTION

Field of the Invention

The invention relates to a converter assembly having a converter, which has converter valves, which each comprise power semiconductor switches.

Such a converter assembly is known from WO 2016/155850 A1, for example. The converter of the known converter assembly is a so-called modular multilevel converter (MMC). The MMC is distinguished by a modular design, in particular. The converter valves extend in each case between an AC voltage terminal and one of two DC voltage poles of the MMC. The converter valves of the MMC each have a series connection of two-pole switching modules, wherein each switching module comprises power semiconductor switches capable of being turned on and off, and also an energy store, preferably in the form of a converter capacitor. Each of the switching modules is drivable individually by means of a driver device. A voltage dropped across the converter valve is equal to the sum of the voltages dropped across the associated switching modules. A particularly advantageous stepped converter voltage is able to be generated by means of the MMC. The switching modules are usually embodied as half-bridge circuits or as full-bridge circuits. The switching module in a half-bridge circuit has two semiconductor switches capable of being turned off and the energy store, wherein the semiconductor switches are interconnected with the energy store such that an energy store voltage dropped across the energy store or a zero voltage is able to be generated at the output terminals of the switching module. Converter assemblies of this type are usually used for current conversion, for example in high-voltage direct current transmission, and also for power factor correction or stabilization of AC voltage systems. In such cases, the converter arm is arranged for example between two AC voltage terminals of the converter.

A further example of a generic converter assembly is known from EP 0 299 275 B1. A converter is described therein, the converter valves of which comprise thyristors arranged in housings in the form of modules. The modules are combined to form valve towers that are mounted in a valve hall.

The valve hall is at a ground potential. During operation of the power converter, the thyristors of the semiconductor circuit are by contrast at different high-voltage potentials, such that the thyristors of the semiconductor circuit have to be electrically insulated from one another and the wall of the valve hall. This is usually done by sufficient air clearance being provided. The minimum distances known from the literature are 1-10 mm/kV. In the case of high voltage differences present at the semiconductor circuit, this results in necessarily large dimensions of the valve hall. The width and the length of the valve hall are usually up to several meters. By way of example, distances of up to 14 m between various high-voltage components and a wall of the hall are necessary in the case of a high-voltage direct current transmission installation having a voltage of 1.4 MV.

FIG. 1 shows the schematic construction of such a valve hall 1 in which a converter of the generic converter assembly can be arranged.

The valve hall 1 in FIG. 1 has a plan of approximately 40 m×60 m. The valve towers arranged therein are at a distance of approximately 15 m from the wall 2 of the valve hall that is at ground potential. Lines that connect the converter to transformers 3, 4 and 5 on the AC voltage side are led out of the valve hall 1 by means of high-voltage bushings (not explicitly illustrated in FIG. 1). Further lines that are led out of the valve hall 1 by means of further high-voltage bushings correspondingly connect the converter to installation parts 6 on the DC voltage side, such as inductors or switchgear installations, for example. A cooling installation 7 for cooling the components of the converter assembly 1 that are situated in the valve hall 1 is situated in a separate container. The valve hall 1 serves to protect the power electronics of the converter with regard to moisture, air quality and temperature and usually additionally requires large air filters and coolers outside the valve hall. Furthermore, each power semiconductor switch requires a dedicated water cooling connection that is connected to a pump circuit.

SUMMARY OF THE INVENTION

The object of the invention is to specify a converter assembly of the generic type which is as simple and cost-effective as possible during production, start-up and operation.

The object is achieved in the case of a converter assembly of the generic type by means of at least one fluid-tight encapsulation housing, in which at least some of the power semiconductor switches are arranged to form a modular converter unit, and which encapsulation housing is at least partly filled with an electrically insulating insulation fluid in order to electrically insulate the power semiconductor switches arranged in said encapsulation housing.

The converter of the converter assembly, or its converter valves, is/are accordingly electrically insulated from the ground potential by means of an insulation fluid. Moreover, the power semiconductor switches of the converter are arranged in at least one fluid-tight encapsulation housing, such that they form one or more modular converter units. The converter units are transportable in comparison with the known valve hall. Consequently, the start-up of the converter assembly can advantageously be simplified. It is conceivable, for example, for each converter valve together with the assigned encapsulation housing to form a modular converter unit. The modular converter units can be connected to one another to form the converter. On account of the fluid insulation, the encapsulation housing advantageously has significantly smaller dimensions than the known valve hall. By way of example, the insulation clearances can even be reduced by a factor of ten to approximately one third in particularly favorable cases. The simple construction and smaller dimensions advantageously allow a cost advantage over the previously known solutions.

In particular, all the power semiconductor switches can be accommodated in one or more encapsulation housings. The encapsulation housing(s) can be completely filled with the insulation fluid.

Preferably, the at least one encapsulation housing is insulated in a liquid-tight manner, wherein the insulation fluid is an insulation liquid. A liquid-tight encapsulation housing is simpler to produce and thus more cost-effective than a corresponding gas-tight encapsulation housing. With the use of an insulation liquid, the insulation clearances can advantageously be reduced further by comparison with gas insulation.

Preferably, the insulation liquid comprises an ester. The insulation liquid is an ester liquid, for example. Esters have proved to be good electrical insulators.

In accordance with one embodiment of the invention, the power semiconductor switches are thyristors. The converter is, for example, a line-commutated converter with a current link circuit (LCC).

In accordance with a further embodiment, the power semiconductor switches are power semiconductor switches capable of being turned on and off. These may be for example IGBTs, IGCTs or the like. The use of the power semiconductor switches capable of being turned off makes it possible to provide a self-commutated converter.

Variants are also conceivable, however, in which the converter comprises both thyristors and power semiconductor switches capable of being turned off.

In accordance with one embodiment of the invention, each of the converter valves has a series connection of two-pole switching modules, wherein each switching module comprises at least two power semiconductor switches and also an energy store, wherein at least some of the switching modules are arranged in the at least one encapsulation housing. In this way, a two-level modular design of the converter is provided, in which the converter valves are constructed modularly with the switching modules (1st level of the modularization), and the converter furthermore has the modular converter units (2nd level of the modularization). The converter can be for example a modular multilevel converter described in the introduction. In this case, the converter valves can comprise switching modules having half-bridge circuits and/or having full-bridge circuits, wherein other switching module topologies are also conceivable.

Preferably, the converter assembly comprises a plurality of modular converter units, wherein at least some of the modular converter units are connectable to one another by means of gas-insulated or liquid-insulated electrical lines to form the converter of the converter assembly, for example a modular multilevel converter. The use of the gas-insulated or liquid-insulated electrical lines for connecting the individual converter units advantageously makes it possible to dispense with the use of high-voltage bushings. This reduces the costs of the converter assembly. The insulation medium of the lines is preferably identical to the insulation medium in the encapsulation housing.

Expediently, the converter assembly furthermore comprises at least one further high-voltage component, wherein the modular converter unit is electrically connectable to the high-voltage component by means of at least one gas-insulated or liquid-insulated electrical line. Accordingly, further components of the converter assembly, such as transformers or switchgear installations, for example, are connected to the converter by means of lines of the same type such as interconnect the modular converter units. A further simplification of the construction of the converter assembly can be achieved as a result.

Preferably, the modular converter unit, in particular each of the converter units, comprises a cooling device having a cooling liquid for cooling the power semiconductors, wherein the cooling liquid is the insulation liquid. In this case, the insulation liquid is used for cooling the power electronic components of the converter. A costly external cooling device can advantageously be dispensed with in this way. Particularly preferably, a convection movement of the insulation liquid is used for heat transfer. An active pump circuit can thus be dispensed with (passive insulating material movement). The thermal conductivity and storage capability of the insulation liquid can be used in particular for heat transfer from the power semiconductor switches for example to the encapsulation housing and to the outside. However, an active insulating material movement by means of suitable pumps is also conceivable.

In accordance with one embodiment of the invention, the cooling device comprises a radiator for dissipating heat, said radiator being arranged on the exterior of the at least one encapsulation housing. The radiator is preferably composed of a material that conducts heat well, such that the heat emitted by the insulation liquid can be passed on to the surroundings of the converter assembly.

DETAILED DESCRIPTION OF THE INVENTION

Figure 1:
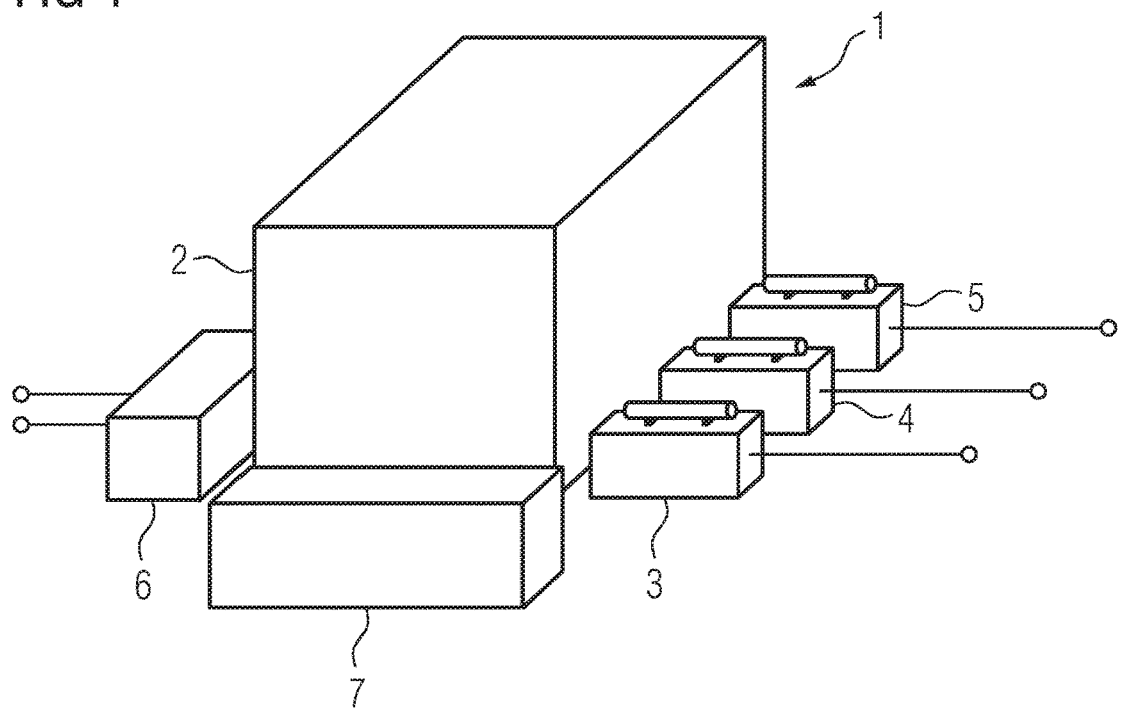
FIG. 1 shows the schematic construction of such a valve hall 1 in which a converter of the generic converter assembly can be arranged.
Figure 2:
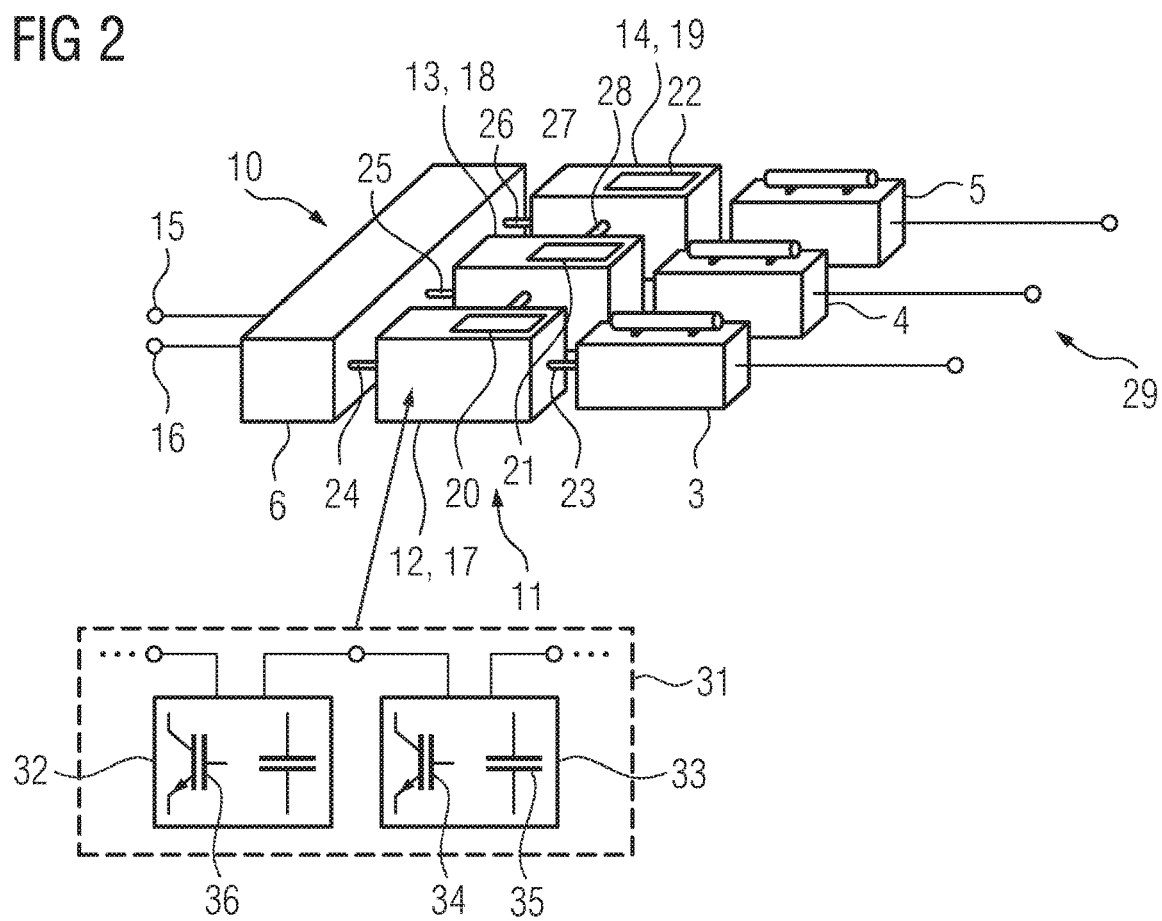
FIG. 2 shows an exemplary embodiment of a converter assembly according to the invention in a schematic illustration.

Specifically, a converter assembly 10 is illustrated in FIG. 2. The converter assembly 10 comprises a converter 11. The converter 11 comprises three modular converter units 12, 13 and 14. The modular converter units 12-14 are constructed in an identical fashion in this example, but generally need not be constructed in an identical fashion. Each converter unit comprises two converter valves of the converter, which extend respectively between a first or a second DC voltage pole 15 or 16 of the converter and an AC voltage terminal of the converter in order to connect the converter to components of the converter assembly that are on the AC voltage side. In the exemplary embodiment illustrated in FIG. 2, the converter units are connected to transformers 3-5 on the AC voltage side.

Each modular converter unit 12-14 comprises a liquid-tight encapsulation housing 17, 18 and 19, respectively. Each encapsulation housing 17-19 is filled with an ester liquid. The ester liquid firstly serves for electrically insulating the power electronic components of the converter valves arranged in the encapsulation housing. The ester liquid secondly serves for heat transfer and thus for cooling the power semiconductor switches of the converter 11. Each encapsulation housing 17-19 furthermore comprises a radiator 20, 21 and 22, respectively, which improves the heat transfer to the outside.

Electrical connections among the converter units 12-14 and also to the components 6 on the DC voltage side (e.g. inductors or switchgear installations) and to the components 3-5 on the AC voltage side (transformers in the example illustrated) are realized by means of fluid-insulated electrical lines 23-28. Only some but not all of the electrical connections of the converter assembly 10 are illustrated graphically in FIG. 2, for reasons of clarity. The transformers 3-5 each have a transformer housing, which is liquid-tight. The electrical insulation within the transformer housings can be provided by an insulation liquid such as, for example, an insulation oil or an ester liquid.

The converter assembly comprises a terminal 29 for connecting the converter assembly 10 to a three-phase AC voltage system.

FIG. 2 also shows a converter valve 31 which is disposed in any of the housings 17-19. The converter valve 31 has two switching modules 32, 33. The switching module 32 includes a semiconductor switch 36 and an energy store. The switching module 33 includes a semiconductor switch 34 and an energy store 35.

The invention claimed is:
1. A converter assembly, comprising:
   a converter including:
      a plurality of separate fluid-tight encapsulation housings;
      a plurality of modular converter units each disposed in a respective one of said separate fluid-tight encapsulation housings;
      said plurality of modular converter units having converter valves each including power semiconductor switches;
      an electrically insulating insulation fluid at least partly filling said plurality of separate encapsulation housings for electrically insulating said power semiconductor switches disposed in said plurality of separate encapsulation housings; and
      pas-insulated or liquid-insulated electrical lines interconnecting said plurality of modular converter units to form said converter.
2. The converter assembly according to claim 1, wherein said at least one encapsulation housing is insulated in a liquid-tight manner and said insulation fluid is an insulation liquid.
3. The converter assembly according to claim 2, wherein said insulation liquid includes an ester.
4. The converter assembly according to claim 2, wherein said modular converter unit includes a cooling device having a cooling liquid for cooling said power semiconductors, and said cooling liquid is said insulation liquid.
5. The converter assembly according to claim 4, wherein said cooling device includes a radiator for dissipating heat, said radiator being disposed on an exterior of said at least one encapsulation housing.
6. The converter assembly according to claim 1, wherein said power semiconductor switches are thyristors.
7. The converter assembly according to claim 1, wherein said power semiconductor switches are power semiconductor switches capable of being turned on and off.
8. The converter assembly according to claim 7, wherein each of said converter valves has a series connection of two-pole switching modules, each switching module includes at least two power semiconductor switches and an energy store, and at least some of said switching modules are disposed in said at least one encapsulation housing.
9. The converter assembly according to claim 1, which further comprises at least one high-voltage component, and at least one gas-insulated or liquid-insulated electrical line for electrically connecting said modular converter unit to said high-voltage component.

* * * * *